US007907224B2

(12) United States Patent
Ito et al.

(10) Patent No.: US 7,907,224 B2
(45) Date of Patent: Mar. 15, 2011

(54) IMAGE DISPLAY DEVICE

(75) Inventors: Manabu Ito, Tokyo (JP); Chihiro Miyazaki, Tokyo (JP)

(73) Assignee: Toppan Printing Co., Ltd. (JP)

( * ) Notice: Subject to any disclaimer, the term of this patent is extended or adjusted under 35 U.S.C. 154(b) by 292 days.

(21) Appl. No.: 12/120,120

(22) Filed: May 13, 2008

(65) Prior Publication Data
US 2008/0284933 A1 Nov. 20, 2008

(30) Foreign Application Priority Data

May 16, 2007 (JP) .................................. 2007-130279

(51) Int. Cl.
G02F 1/136 (2006.01)
G02F 1/1335 (2006.01)
(52) U.S. Cl. .......................................... 349/43; 349/106
(58) Field of Classification Search .................... 349/43, 349/106; 257/59, 72
See application file for complete search history.

(56) References Cited

U.S. PATENT DOCUMENTS

2007/0252928 A1* 11/2007 Ito et al. ........................ 349/106

OTHER PUBLICATIONS

Ito, M. et al., "A Novel Display Stucture for Color Electronic Paper Driven with Fully Transparent Amorphous Oxide TFT Array", *IDW*, pp. 585-586 (2006).

* cited by examiner

*Primary Examiner* — David Nelms
*Assistant Examiner* — David Y Chung
(74) *Attorney, Agent, or Firm* — Squire, Sanders & Dempsey (US) LLP

(57) ABSTRACT

One embodiment of the present invention is an image display device including a substantially transparent substrate, a color filter layer formed on the substantially transparent substrate and a substantially transparent semiconductor circuit formed on the color filter layer. The circuit includes a substantially transparent thin film transistor including a source electrode, a drain electrode, a gate insulating film, a gate electrode and a semiconductor active layer comprised of a metal oxide. The semiconductor active layer has a thickness of 10 nm-35 nm. The circuit also includes a wiring made of a substantially transparent conductive material, the wiring having a electric contact point with the substantially transparent thin film transistor.

9 Claims, 4 Drawing Sheets

US 7,907,224 B2

IMAGE DISPLAY DEVICE

CROSS REFERENCE TO RELATED APPLICATION

This application is based on and claims the benefit of priority from the Japanese Patent Application number 2007-130279, filed on May 16, 2007; the entire contents of which are incorporated herein by reference.

BACKGROUND OF THE INVENTION

1. Field of the Invention

The present invention is related to an image display device. Especially, the present invention is related to an image display device in which position adjustment between a semiconductor circuit and a color filter is easy and reliability is high.

2. Description of the Related Art

A thin film transistor having an amorphous silicon or a polycrystal silicon has been generally used for a transistor for driving an electronic device. However, since the amorphous silicon and the polycrystal silicon are not transparent and are optically sensitive in the region of visible light, a light shielding film is necessary. Therefore, since a semiconductor circuit including a thin film transistor, a wiring thereof and the like becomes a problem in visibility, the semiconductor circuit has been arranged in a back side of an observation side of an image display element.

A color filter is generally used in order to make a full-color reflective type display device such as a reflective type liquid crystal display device and an electrophoresis display device. However, from the above-mentioned reason, a liquid crystal sealing layer or an electrophoresis particle layer is formed between a color filter and a thin film transistor substrate. However, if a color filter and a semiconductor circuit substrate are formed at such positions, for example, in the case of a liquid crystal, after a liquid crystal is sealed, position adjustment between a semiconductor circuit and a color filter is needed. Therefore, it is difficult to achieve a high accuracy. This cause an increase of costs and a reduction of yield. Therefore, research and development are performed in order to realize a display device in which a transparent semiconductor circuit is directly formed on a color filter, thereby the position adjustment is easy.

If a display has such a structure, position adjustment between a color filter and a semiconductor circuit becomes easy. However, in the case of this structure, because a semiconductor circuit is arranged in a front side of an image display element, the front side being a viewer side, false operation of a thin film transistor may occur when a semiconductor circuit is irradiated with outside light such as sunlight. In fact, it was found that an oxide semiconductor is transparent while band gap thereof is frequently 3.0 eV-3.5 eV, thereby false operation of a thin film transistor occurs by photoelectric current flowing in a semiconductor active layer by irradiation with sunlight in the case where the band gap is within such a range. Therefore, it was found that a problem in displaying an image occurs in the case where a display having such a structure is used at a very bright place such as a outdoor place. In addition, this type image display device is disclosed, for example, in the following non-patent document.

One of the many objects of the present invention is to provide an image display device in which position adjustment between a semiconductor circuit and a color filter is easy and reliability is high.

[non-patent document] M. Ito et al., Proc. 13th IDW, 585 (2006)

SUMMARY OF THE INVENTION

One embodiment of the present invention is an image display device including
a substantially transparent substrate,
a color filter layer formed on the substantially transparent substrate
and a substantially transparent semiconductor circuit formed on the color filter layer, the circuit including a substantially transparent thin film transistor including a source electrode, a drain electrode, a gate insulating film, a gate electrode and a semiconductor active layer comprised of a metal oxide, the semiconductor active layer having a thickness of 10 nm-35 nm, and further the circuit including a wiring made of a substantially transparent conductive material, the wiring having a electric contact point with the substantially transparent thin film transistor.

In these drawings, 1 is an image display element; 2 is a substantially transparent semiconductor circuit; 3 is a substantially transparent substrate; 4 is a color filter layer; 5 is a substrate; 6 is a gate electrode; 7 is an auxiliary capacitor electrode; 8 is a gate insulating film; 9 is a source electrode; 10 is a drain electrode; 11 is a semiconductor active layer; 12 an interlayer dielectric; 13 is a pixel electrode; 14 is a common electrode; 20 is a phase difference plate; 21 is a polarizing film; 22 is an oriented film; 23 is a liquid crystal; 24 is an oriented film; 25 is a common electrode; 26 is a substrate for an image display element; 100 is one pixel of an image display device; and 200 is an image display device.

DETAILED DESCRIPTION OF THE INVENTION

Embodiments of the present invention are described referring to figures. However, the present invention is not limited to these embodiments.

Figure 1:
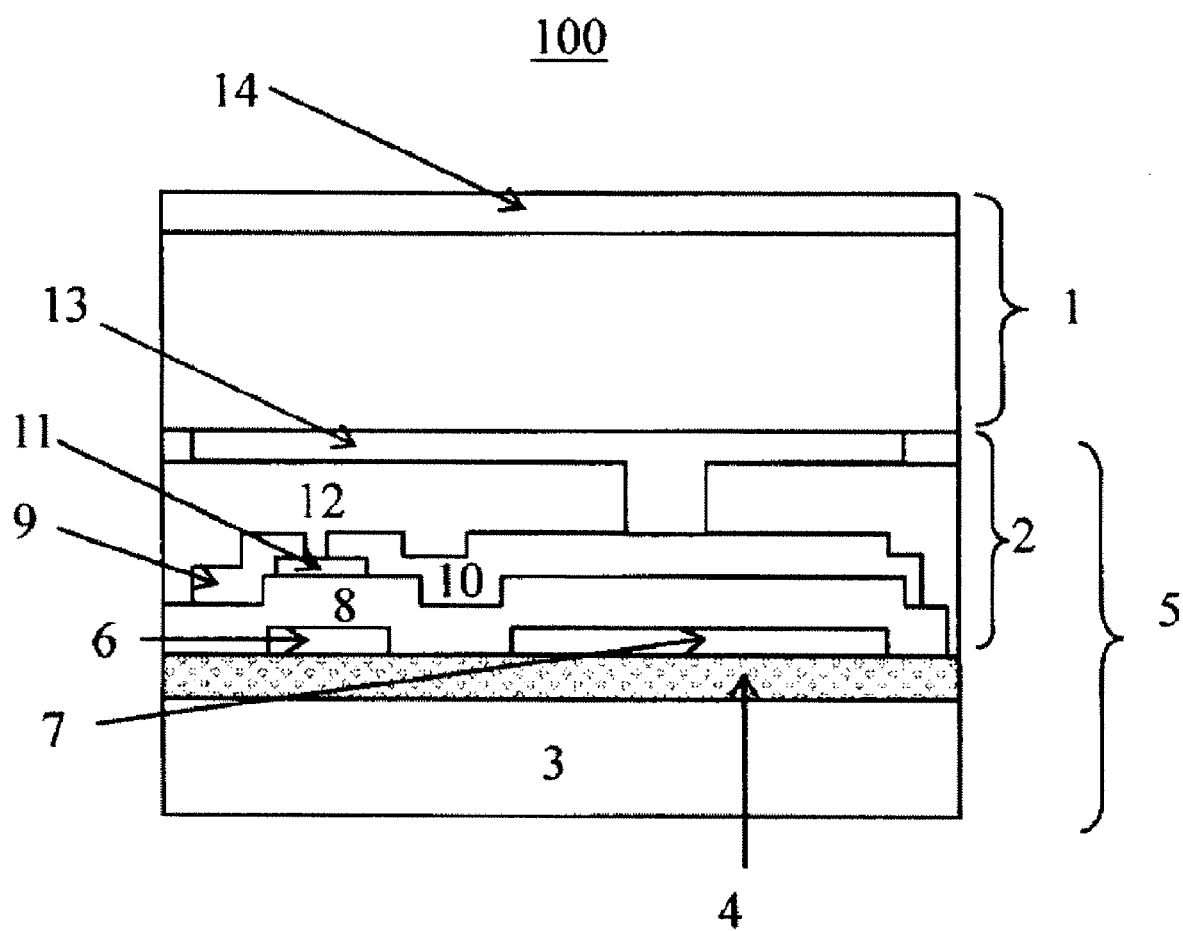
FIG. 1 is a partially cross-sectional diagram of one pixel of an image display device of an embodiment of the present invention.

As shown FIG. 1, One pixel 100 of an image display device on an embodiment of the present invention includes a substantially transparent substrate 3, a color filter layer 4, a gate electrode 6, a semiconductor active layer 11, a pair of main electrode regions (a source electrode 9 and a drain electrode 10), an interlayer dielectric 12, a pixel electrode 13, a image display element 1 and a common electrode 14.

Figure 2:
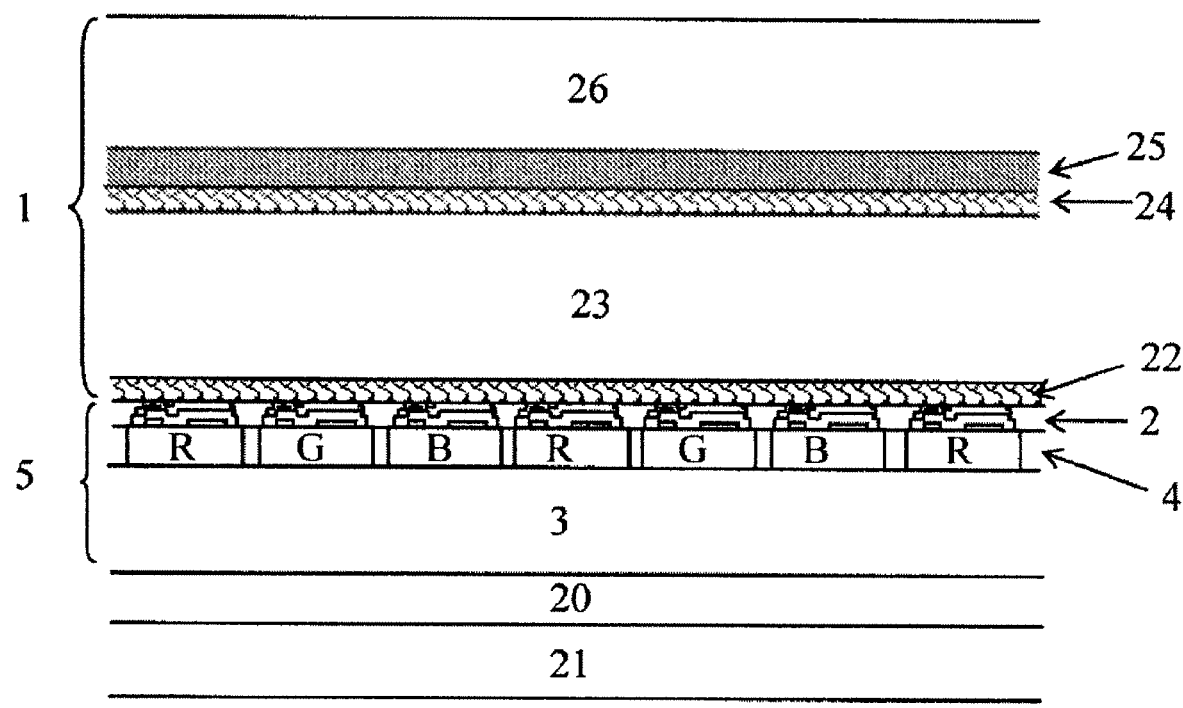
FIG. 2 is a schematic cross-sectional diagram of a reflective type image display device of an example of the present invention.

As shown in FIG. 2, an image display device 200 of an embodiment of the present invention includes one pixel 100 of an image display device arranged as a matrix-shaped pattern. A phase difference plate 20 and a polarizing film 21 is placed under the substantially transparent substrate 3. A liquid crystal 23 is used for an image display element 1.

A substrate over which the color filter layer 4 and a substantially transparent semiconductor circuit 2 are formed must be substantially transparent. Here, "substantially transparent" means that transmittance is 70% or more in a wave length region of 400 nm-700 nm which is a wave length region of a visible light.

Preferably, polymethyl methacrylate, acrylics, polycarbonate, polystyrene, polyethylene sulfide, polyethersulfone, polyolefin, polyethylene terephthalate, polyethylenenaphthalate, cyclo-olefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, transparent polyimide, fluorinated resin, cyclic polyolefin resin, glass and quartz can be used. However, usable materials are not limited to these.

A substrate comprising only one material among above mentioned materials can be used, but a composite substrate comprising two or more materials among above mentioned materials can be used.

In addition, when a substrate is an organic film, it is preferable to form a transparent gas barrier layer (not illustrated in the figure) in order to raise the durability of an element.

$Al_2O_3$, $SiO_2$, SiN, SiON, SiC, diamondlike carbon (DLC) or the like can be used for a gas barrier layer, but usable materials are not limited to these materials. In addition, a gas barrier layer may comprise two or more layers. In addition, a gas barrier layer may be formed only on one side of an organic film substrate, and it may be formed on both sides.

A gas barrier layer can be formed by evaporation method, ion plating method, sputter method, laser ablation method, plasma CVD (Chemical Vapor Deposition) method, hot wire CVD method and sol-gel process, but usable methods are not limited to these methods.

Oxide materials such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), zinc tin oxide ($Zn_2SnO_4$) and indium zinc oxide (In—Zn—O) can be used for a gate electrode 6, a source electrode 9, a drain electrode 10, an auxiliary capacitor electrode 7, a pixel electrode 13, a scanning line electrode (not illustrated in the figure) and a signal line electrode (not illustrated in the figure) used for a substantially transparent semiconductor circuit 2 of the present invention.

In addition, these materials doped with impurity are preferably used.

For example, indium oxide doped with tin (Sn), molybdenum (Mo) or titanium (Ti), tin oxide doped with antimony (Sb) or fluorine (F), and zinc oxide doped with indium, aluminium and gallium (Ga) can be used. Among these doped materials, indium tin oxide (common name ITO) which is indium oxide doped with tin (Sn) is preferably used, because ITO has a high transparency and a low electrical resistivity.

In addition, an electrode having plural layers in which the above mentioned conductive oxide material and a metal thin film such as Au, Ag, Cu, Cr, Al, Mg and Li are laminated can be used. For this case, in order to prevent oxidation and time degradation of metallic material, three-layer structure, that is, conductive oxide thin film/metallic thin film/conductivity oxide thin film, is preferably used. In addition, a metallic thin film layer should be as thin as possible, not to disturb visibility of display unit by light reflection and light absorption at a metallic thin film layer. To be concrete, it is desirable to be 1 nm-20 nm.

In addition, organic conducting materials such as PEDOT (polyethylene dihydroxy thiophen) can be preferably used.

As for a gate electrode 6, a source electrode 9, a drain electrode 10, an auxiliary capacitor electrode 7, a pixel electrode 13, a scanning line electrode (not illustrated in the figure) and a signal line electrode (not illustrated in the figure), materials of them may be identical or all of the materials may be different from each other.

However, in order to reduce the number of the processes, it is preferable that materials of a gate electrode 6 and an auxiliary capacitor electrode 7 are identical and materials of a source electrode 9 and a drain electrode 10 are identical.

These transparent electrodes can be formed by vacuum evaporation method, ion plating method, sputter method, laser ablation method, plasma CVD technique, photo-CVD, hot wire CVD method, screen printing, relief printing and ink jet method, but usable methods are not limited to these methods.

In addition, in order to increase the degree of transparency of these transparent electrodes, heating a substrate during a film formation and a thermal processing of a substrate after a film formation are preferably performed. However, it is desirable that a temperature of a substrate be equal to or less than 230 degrees Celsius in order not to damage a color filter layer 4 which is an underlayer.

An oxide semiconductor material can be preferably used for a substantially transparent semiconductor active layer 11 used for an image display device of the present invention.

Examples of the oxide semiconductor material include zinc oxide, indium oxide, indium zinc oxide, tin oxide, tungsten oxide (WO) and zinc gallium indium oxide (In—Ga—Zn—O) which are oxides including one or more element among zinc, indium, tin, tungsten, magnesium and gallium. However, usable oxide semiconductor materials are not limited to these.

It is desirable that these materials are substantially transparent and the band gab is equal to or more than 2.8 eV, more preferable is equal to or more than 3.2 eV.

Structure of these materials may be monocrystal, polycrystal, crystallite, mixed crystal of crystal/amorphous, nanocrystal scattering amorphous or amorphous.

In addition, it is desirable that electron carrier concentration of the oxide semiconductor material be equal to or less than $10^{18}/cm^3$.

An oxide semiconductor layer can be formed by sputter method, pulsed laser deposition, vacuum evaporation method, CVD method, MBE (Molecular Beam Epitaxy) method and sol-gel process, however sputter method, pulsed laser deposition, vacuum evaporation method and CVD method are preferably used.

For sputter method, RF magnetron sputtering technique and DC sputter method can be used. For vacuum deposition, heating evaporation, electron beam evaporation and ion plating method can be used. For CVD method, hot wire CVD method and plasma CVD technique can be used. However, usable methods are not limited to these methods.

In the case where a film thickness of a semiconductor active layer 11 is 10 nm-35 nm, yield is high and influence by light irradiation can be almost inhibited.

If a film thickness is less than 10 nm, a little ununiformity of a film thickness generated in a manufacturing process causes a problem. That is, a film formation of a semiconductor active layer 11 can not sufficiently performed so that a semiconductor active layer 11 does not fully functions. Thereby, yield becomes low.

If a film thickness is more than 35 nm, light absorption occurs at a semiconductor active layer 11. Thereby, error in operating a thin film transistor occurs.

Inorganic materials such as silicon oxide, silicon nitride, silicon oxy nitride, aluminium oxide, tantalum oxide, yttria, hafnium oxide, hafnium aluminates, oxidation zirconia and titanium oxide, or polyacrylates such as PMMA (polymethyl methacrylate), PVA (polyvinyl alcohol), PS (polystyrene), transparent polyimide, polyester, epoxy, poly vinylphenol and polyvinyl alcohol can be used for a material used for a gate insulating film 8 of a thin film transistor used in the present invention. However, a usable material is not limited to these.

In order to control a gate leak current, electrical resistivity of insulating materials should be equal to or more than $10^{11}$ Ωcm, and more preferably it should be equal to or more than $10^{14}$ Ωcm.

A gate insulating film 8 can be formed by vacuum evaporation method, ion plating method, sputter method, laser ablation method, plasma CVD technique, photo-CVD, hot wire CVD method, spin coat, dip coat, screen printing or the like. It is desirable for a thickness of an insulating film 8 to be 50 nm-2 μm. These gate insulating films 8 may be used as monolayer. In addition, it may have plural layers. In addition, as for the gate insulating film, a composition may slope toward growth direction of the film.

Structure of a thin film transistor used in the present invention is not especially limited.

It may be bottom contact type or a top contact type.

In addition, the following processes are preferably used in order to raise an aperture ratio: interlayer dielectric is provided on a thin film transistor used in the present invention; and pixel electrode 13 is provided on an interlayer dielectric 12, wherein pixel electrode 13 is electrically connected to drain electrode 10.

Interlayer dielectric 12 should be substantially transparent and have insulating properties.

For example, inorganic materials such as silicon oxide, silicon nitride, silicon oxy nitride (SiNxOy), aluminium oxide, tantalum oxide, yttria, hafnium oxide, hafnium aluminates, zirconia oxide and titanium oxide, and organic materials such as polyacrylates such as PMMA (polymethyl methacrylate), PVA (polyvinyl alcohol), PS (polystyrene), transparent polyimide, polyester, epoxy, poly vinylphenol, polyvinyl alcohol or the like can be used, however usable materials are not limited to these materials.

An interlayer dielectric 12 may be formed by same material as a gate insulating film 8, and it may be formed by a material different from a gate insulating film 8.

These interlayer dielectrics may be used as a monolayer, and these interlayer dielectrics comprising plural layers may be used.

In the case of a device of a bottom gate structure, a protection film covering a semiconductor active layer 11 is preferably formed. A protective film can prevent a semiconductor active layer 11 from changing with time due to humidity and can prevent a semiconductor active layer 11 from being influenced by an interlayer dielectric 12.

As a protection film, inorganic materials such as silicon oxide, silicon nitride, silicon oxy nitride (SiNxOy), aluminium oxide, tantalum oxide, yttria, hafnium oxide, hafnium aluminates, zirconia oxide, titanium oxide, and, polyacrylates such as PMMA (polymethyl methacrylate), PVA (polyvinyl alcohol), PS (polystyrene), transparent polyimide, polyester, epoxy, poly vinylphenol, polyvinyl alcohol and fluorinated resin can be used, however usable materials are not limited to these materials.

These protection films may be used as a monolayer, and these protection films comprising plural layers may be used.

In addition, a pixel electrode 13 should be electrically connected with a drain electrode 10 of a thin film transistor.

Concrete embodiments are illustrated as follows:

Interlayer dielectric 12 in a part of drain electrode 10 can be not formed by forming pattern-shaped interlayer dielectric by a method such as screen printing; and After having applied interlayer dielectric 12 to whole area, hole can be formed in interlayer dielectric 12 by laser beam.

It is desirable that color filter 4 used in the present invention include three filters, that is, red filter (R), green filter (G) and blue color filter (B), or include red color filter (R), green color filter (G), blue color filter (B) and white color filter (W). However, embodiments of color filter 4 are not limited to these.

As for the color layer of the color filter layer 4, each color filter (R, G, B or R, G, B, W) is patterned like the form of filament (stripe) matrix of a predetermined width or the form of rectangle matrix of a predetermined size.

In addition, after forming a coloring pattern, a transparent overcoat is preferably formed on a color filter layer 4 in order to protect a coloring pattern and to lower unevenness of a color filter layer 4.

The following devices can be used for an image display element 1 for the present invention: a liquid crystal display device including a liquid crystal; an electrophoresis display device which is filled with an electric-charged electrophoresis particle dispersed in a dispersion solution; a rotatory particle display device which is filled with a rotatory particle having an electric-charged surface region dispersed in a dispersion solution; and, an electron powder fluid type display device which is filled with a power fluid and in which the powder fluid moves. However, a liquid crystal display device and an electrophoresis display device are preferred.

In addition, a reflective type image display element 1 used for the present invention is arranged in a back side of a thin film transistor wherein the back side is not a viewer side. Therefore, a common electrode 14 formed in an image display element 1 in the present invention can be a transparent conductive film and may be an opaque electrode. The following materials can be used for the common electrode; oxide materials such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), zinc tin oxide ($Zn_2SnO_4$) and indium zinc oxide (In—Zn—O); metals such as Au, Ag, Cu, Cr, Al, Mg, Li, Ni and NiCr; and mixed material of these materials.

From the same reason, a substrate for an image display element 1 can be transparent or opaque. Further, the substrate can be flexible or not flexible.

For the substrate, polymethyl methacrylate, acrylics, polycarbonate, polystyrene, polyethylene sulfide, polyethersulfone, polyolefin, polyethylene terephthalate, polyethylenenaphthalate, cyclo-olefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, transparent polyimide, fluorinated resin, cyclic polyolefin resin, glass and quartz can be used concretely.

A substrate comprising only one material among above mentioned materials can be used, however a composite substrate comprising two or more materials among above mentioned materials can be used.

In addition, a conductive material is used for a substrate of an image display element 1 of the present invention, thereby the substrate can be used as a common electrode 14. For example, a thin stainless steel plate, an aluminum foil and a thin copper plate can be used. In the case where a conductive material is used for a substrate of a facade plate of a reflective type display device, it is desirable that an insulating layer or an insulating property material be formed on a side of the substrate wherein the facade plate is not formed on the side.

According to the present invention, a display device can be provided in which a manufacturing cost is low and position adjustment between a color filter and a semiconductor circuit is easy. This is because a substantially transparent circuit is formed on a color filter formed on a substantially transparent substrate, thereafter this element is arranged in a front surface of an image display element.

Example 1

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4. Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 15 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3·m thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10·m and a gate width of the thin film transistor was 50·m. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Example 1 was obtained.

Example 2

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4. Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 25 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3 μm thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10 μm and a gate width of the thin film transistor was 50 μm. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Example 2 was obtained.

Example 3

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4. Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 35 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3 μm thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10 μm and a gate width of the thin film transistor was 50 μm. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Example 3 was obtained.

Comparative Example 1

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4. Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 7 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3 μm thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10 μm and a gate width of the thin film transistor was 50 μm. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Comparative Example 1 was obtained.

Comparative Example 2

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4. Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 40 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3 μm thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10 μm and a gate width of the thin film transistor was 50 μm. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Comparative Example 2 was obtained.

Comparative Example 3

Alkali-free glass 1737 (thickness 0.7 mm) made by Corning were used for substantially transparent plate substrate 3. Color filter layer 4 of R (red), G (green) and B (blue) was formed on one side of the substrate 3. An over coat layer made of a transparent resin was formed on the color filter layer 4.

Next, ITO thin film of 50 nm thickness was formed on the color filter layer 4 by DC magnetron sputtering technique. Thereafter, a desired pattern of ITO was obtained by performing patterning of ITO while position adjustment between the ITO thin film and each pixel of the color filter layer 4 was performed. In this way, gate electrode 6 and auxiliary capacitor electrode 7 were obtained. Further, gate insulating film 8 was formed by forming SiON thin film of 330 nm thereon by RF sputtering technique using a target of silicon nitride ($Si_3N_4$). Further, an amorphous In—Ga—Zn—O thin film of 50 nm thickness was formed as a semiconductor active layer 11 by RF sputtering technique using $InGaZnO_4$ target. Patterning of the amorphous In—Ga—Zn—O thin film was performed. A resist was applied thereon, thereafter drying and development of the resist was performed. Next, ITO film of 50 nm was formed by DC magnetron sputtering technique. Source electrode 9 and drain electrode 10 was formed by a liftoff method. Further, an epoxy type resin was applied by a spin coat method to 3 μm thickness. A through hole was formed on the drain electrode by a photolithography method. Thereby, interlayer dielectric 12 was formed. Next, finally, ITO film was formed by magnetron sputtering technique to 100 nm thickness. Patterning of the ITO film was performed, thereby pixel electrode 13 was formed. The film forming condition is shown in Table. 1. In addition, all of film formations were performed at a room temperature. After these manufacturing processes, thermal processing at 200 degrees Celsius for 1 hour in the atmosphere was performed in order to increase the degree of transparency of the semiconductor circuit. Here, the manufactured transparent semiconductor circuit 2 was a thin film transistor array with pixels of 160× 120. In addition, a gate length of the thin film transistor was 10 μm and a gate width of the thin film transistor was 50 μm. Oriented film 22 was applied on the substantially transparent semiconductor circuit 2 manufactured in this way. An alkali-free glass 1737 (thickness 0.7 mm: made by Corning) having ITO thin film of 70 nm thickness as a common electrode 25 having an oriented film 24 on the common electrode is arranged through spacers on the substrate with the thin film transistor. Thereafter, a space between the spacers was filled with a liquid crystal. Finally, a phase difference plate 20 and a polarizing plate 21 were arranged on a surface of the substantially transparent substrate 3, the surface being not a surface on which the color filter was placed. In this way, a display device of Comparative Example 3 was obtained.

TABLE 1

|  | Target | Flow rate of Ar [SCCM] | Flow rate of $O_2$ [SCCM] | Operating pressure [Pa] | Input power [W] |
|---|---|---|---|---|---|
| Gate electrode 6 and auxiliary capacitor electrode 7 | $SnO_2$: 5 wt. %-$In_2O_3$ | 10 | 0.3 | 0.5 | 200 |
| Gate insulating film 8 | $Si_3N_4$ | 40 | 2 | 0.5 | 200 |
| Semiconductor active layer 11 | $InGaZnO_4$ | 10 | 0.2 | 0.5 | 200 |
| Source electrode 9 and drain electrode 10 | $SnO_2$: 5 wt. %-$In_2O_3$ | 10 | 0.3 | 0.5 | 200 |
| Pixel electrode 13 | $SnO_2$: 5 wt. %-$In_2O_3$ | 10 | 0.2 | 1.0 | 50 |

Figure 3:
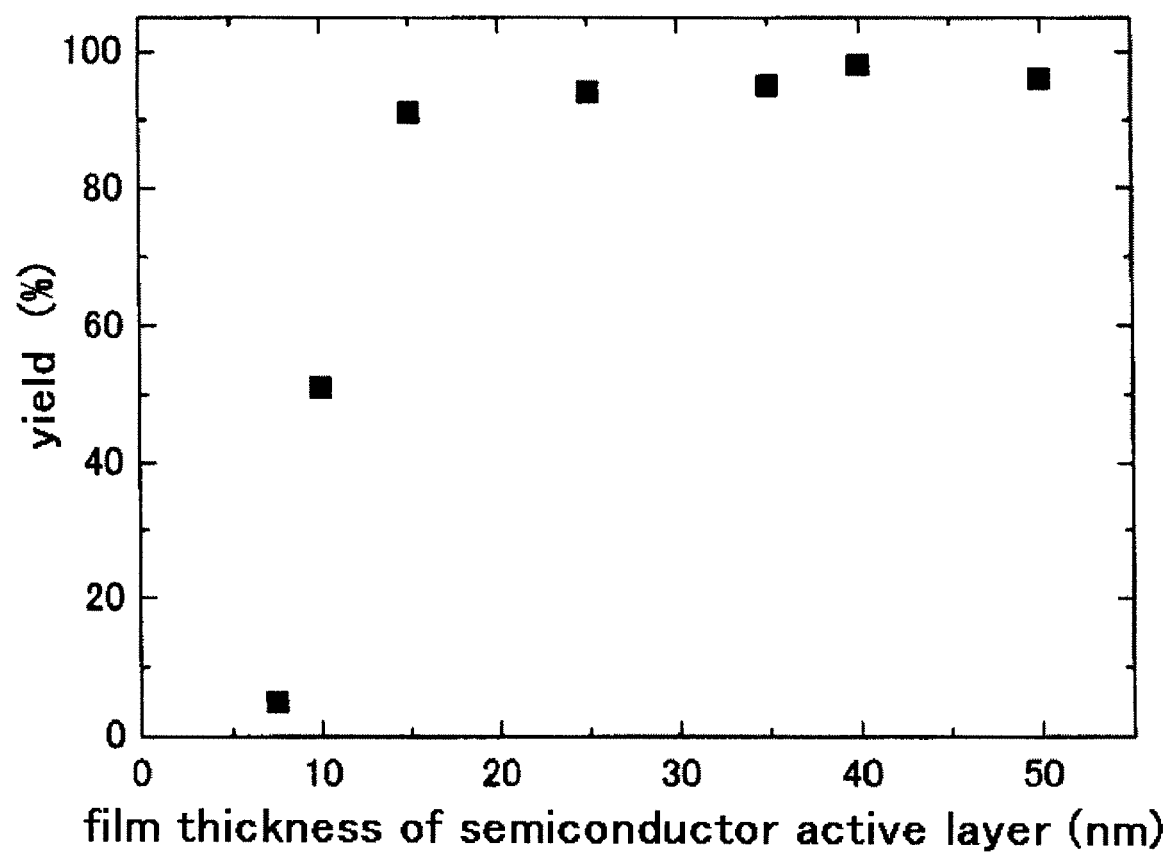
FIG. 3 shows yields of a pixel when a film thickness of a semiconductor layer is changed.
Figure 4:
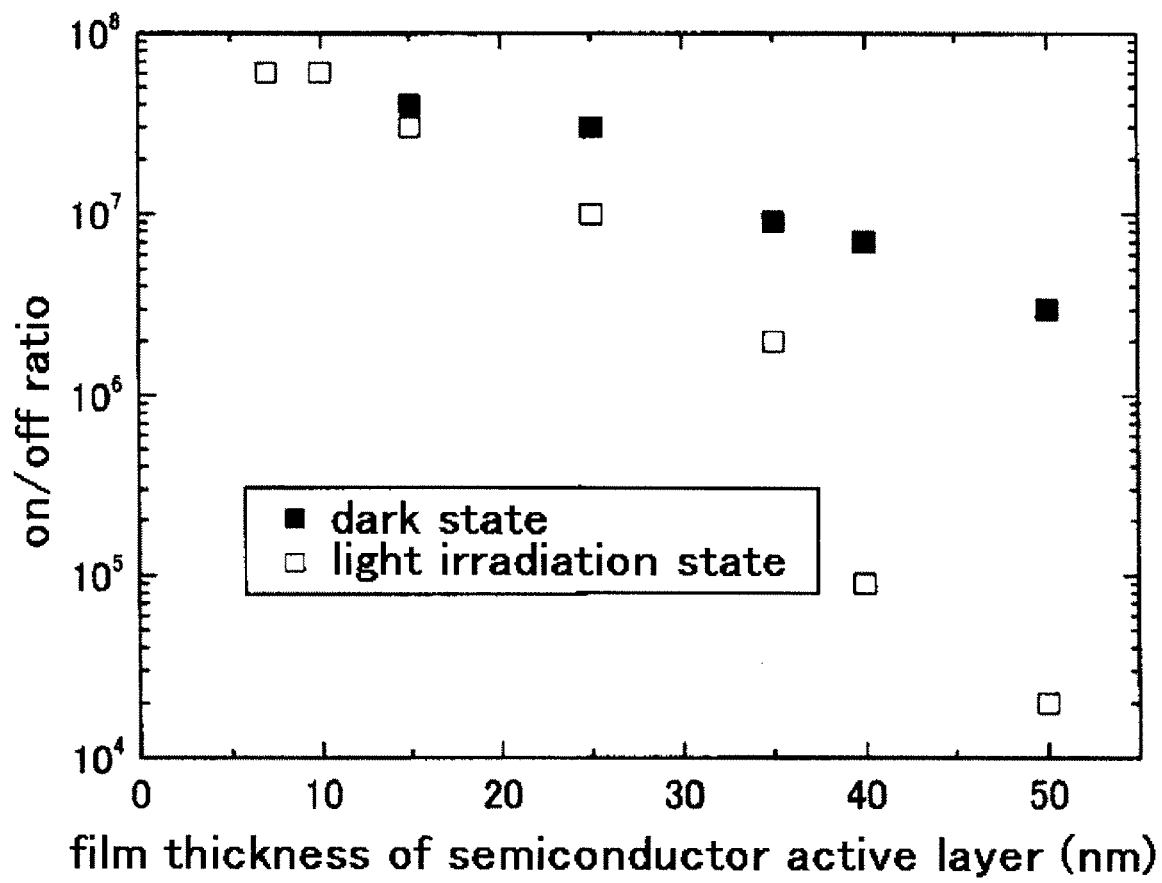
FIG. 4 shows on/off ratios both in a dark state and in a light irradiation state when a film thickness of a semiconductor layer is changed.

Table 2, FIG. 3 and FIG. 4 show yield of each pixel (ratio: the number of normally operating pixels/the number of all pixels) of image display devices manufactured in Examples 1-3 and Comparative Examples 1-3, and show operating characteristics of thin film transistors in transparent semiconductor circuits 2 (on/off ratio both in a dark state and in a light irradiation state) manufactured in Examples 1-3 and Comparative Examples 1-3. Here, in light irradiation, it was irradiated with reference solar light AM 1.5 (pseudo-sunlight: a product of OLEELU company) and measurements were performed.

TABLE 2

| | Film thickness (nm) of semiconductor active layer | Yield (%) | Dark state On/off ratio | light irradiation state On/off ratio |
|---|---|---|---|---|
| Example 1 | 15 | 91 | $4 \times 10^7$ | $6 \times 10^7$ |
| Example 2 | 25 | 94 | $3 \times 10^7$ | $6 \times 10^7$ |
| Example 3 | 35 | 95 | $9 \times 10^6$ | $3 \times 10^7$ |
| Comparative Example 1 | 7 | 5 | $6 \times 10^7$ | $1 \times 10^7$ |
| Comparative Example 2 | 40 | 98 | $7 \times 10^6$ | $9 \times 10^5$ |
| Comparative Example 3 | 50 | 96 | $3 \times 10^6$ | $2 \times 10^5$ |

Table 1, FIG. 3 and FIG. 4 clearly show that yield of a thin film transistor is remarkably reduced in the case where a film thickness of a semiconductor active layer is less than 15 nm, and clearly show that the on/off ratio in a light irradiation state is remarkably reduced in the case where a film thickness of a semiconductor active layer is more than 35 nm.

As mentioned-above, if a substantially transparent semiconductor circuit is formed on a color filter, visibility is not influenced while position adjustment between a color filter and a semiconductor circuit can be easily performed. Further, if a film thickness of an active layer of a semiconductor layer is 10 nm-35 nm, an image display device can be obtained in which yield is high and influence of light irradiation can be almost avoided.

What is claimed is:

1. An image display device, comprising:
   a substantially transparent substrate;
   a color filter layer formed on the substantially transparent substrate; and
   a substantially transparent semiconductor circuit formed on the color filter layer, comprising:
      a substantially transparent thin film transistor, comprising:
         a source electrode;
         a drain electrode;
         a gate insulating film;
         a gate electrode; and
         a semiconductor active layer comprised of an amorphous zinc gallium indium oxide, the semiconductor active layer having a thickness of 15 nm-35 nm, the amorphous zinc gallium indium oxide having electron carrier concentration being equal to or less than $10^{18}/cm^3$;

and
a wiring made of a substantially transparent conductive material, the wiring having a electric contact point with the substantially transparent thin film transistor,
wherein the substantially transparent semiconductor circuit has on/off ratio of $3\times10^7$-$6\times10^7$ in a light irradiation state.

2. The image display device according to claim 1, wherein an image display element is formed on the substantially transparent semiconductor circuit.

3. The image display device according to claim 2, wherein the image display element includes a liquid crystal cell or an electrophoresis particle.

4. An image display device, comprising:
a substantially transparent substrate;
a color filter layer formed on the substantially transparent substrate; and
a substantially transparent semiconductor circuit formed on the color filter layer, comprising:
  a substantially transparent thin film transistor, comprising:
    a source electrode;
    a drain electrode;
    a gate insulating film;
    a gate electrode; and
    a semiconductor active layer comprised of an amorphous zinc gallium indium oxide, the semiconductor active layer having a thickness of 15 nm, the amorphous zinc gallium indium oxide having electron carrier concentration being equal to or less than $10^{18}/cm^3$;
and
a wiring made of a substantially transparent conductive material, the wiring having a electric contact point with the substantially transparent thin film transistor,
wherein the substantially transparent semiconductor circuit has on/off ratio of $6\times10^7$ in a light irradiation state.

5. The image display device according to claim 4, wherein an image display element is formed on the substantially transparent semiconductor circuit.

6. The image display device according to claim 5, wherein the image display element includes a liquid crystal cell or an electrophoresis particle.

7. An image display device, comprising:
a substantially transparent substrate;
a color filter layer formed on the substantially transparent substrate; and
a substantially transparent semiconductor circuit formed on the color filter layer, comprising:
  a substantially transparent thin film transistor, comprising:
    a source electrode;
    a drain electrode;
    a gate insulating film;
    a gate electrode; and
    a semiconductor active layer comprised of a metal oxide, the semiconductor active layer having a thickness of 10 nm-35 nm, the metal oxide having electron carrier concentration being equal to or less than $10^{18}/cm^3$;
and
a wiring made of a substantially transparent conductive material, the wiring having a electric contact point with the substantially transparent thin film transistor.

8. The image display device according to claim 7, wherein an image display element is formed on the substantially transparent semiconductor circuit.

9. The image display device according to claim 8, wherein the image display element includes a liquid crystal cell or an electrophoresis particle.

* * * * *